US011322649B2

(12) United States Patent
Chudzik et al.

(10) Patent No.: US 11,322,649 B2
(45) Date of Patent: May 3, 2022

(54) THREE COLOR LIGHT SOURCES INTEGRATED ON A SINGLE WAFER

(71) Applicant: Applied Materials, Inc., Santa Clara, CA (US)

(72) Inventors: Michael Chudzik, Mountain View, CA (US); Errol Antonio C. Sanchez, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/021,391

(22) Filed: Sep. 15, 2020

(65) Prior Publication Data

US 2022/0085238 A1    Mar. 17, 2022

(51) Int. Cl.
| | |
|---|---|
| *H01L 33/00* | (2010.01) |
| *H01L 33/08* | (2010.01) |
| *H01L 33/32* | (2010.01) |
| *H01L 33/24* | (2010.01) |
| *H01L 33/06* | (2010.01) |

(52) U.S. Cl.
CPC .......... *H01L 33/08* (2013.01); *H01L 33/0062* (2013.01); *H01L 33/0075* (2013.01); *H01L 33/06* (2013.01); *H01L 33/24* (2013.01); *H01L 33/32* (2013.01)

(58) Field of Classification Search
CPC ......... H01L 33/32; H01L 33/08; H01L 33/12; H01L 33/0075; H01L 33/24; H01L 33/00–6; H01L 33/30
See application file for complete search history.

(56) References Cited

U.S. PATENT DOCUMENTS

| | | |
|---|---|---|
| 2017/0323925 A1 | 11/2017 | Schneider, Jr. et al. |
| 2020/0135976 A1 | 4/2020 | Dussaigne |
| 2020/0152612 A1 | 5/2020 | Chen et al. |

FOREIGN PATENT DOCUMENTS

| | | |
|---|---|---|
| CN | 110416249 A | 11/2019 |
| KR | 2011-0131801 A | 12/2011 |

OTHER PUBLICATIONS

Jiang, F., et al., "Efficient InGaN-based yellow-light-emitting diodes", Photonics Research, vol. 7, Issue 2, Year 2019, pp. 144-148, doi.org/10.1364/PRJ.7.000144.

(Continued)

*Primary Examiner* — Savitri Mulpuri
(74) *Attorney, Agent, or Firm* — Kilpatrick Townsend & Stockton LLP

(57) ABSTRACT

Exemplary devices may include a substrate, a dielectric layer formed on the substrate, a first light source configured to emit first light characterized by a first wavelength, a second light source configured to emit second light characterized by a second wavelength different from the first wavelength, and a third light source configured to emit third light characterized by a third wavelength different from the first wavelength and the second wavelength. The first light source may be natively formed on a first region of the substrate and arranged within a first opening of the dielectric layer. The second light source may be natively formed on a second region of the substrate and arranged within a second opening of the dielectric layer. The third light source may be natively formed on a third region of the substrate and arranged within a third opening of the dielectric layer.

10 Claims, 9 Drawing Sheets

(56) References Cited

OTHER PUBLICATIONS

Rishinaramangalam, A. K., et al., "Semipolar InGaN/GaN nanostructure light-emitting diodes on c-plane sapphire", Applied Physics Express, vol. 9, No. 3, Year 2016, doi.org/10.7567/APEX.9.032101.
Pasayat, S.S., et al., "Fabrication of relaxed InGaN pseudo-substrates composed of micron-sized pattern arrays with high fill factors using porous GaN", Semiconductor Science and Technology, vol. 34, No. 11, Year 2019, doi.org/10.1088/1361-6641/ab4372.
International Search Report and Written Opinion dated Jan. 3, 2022 in International Patent Application No. PCT/US2021/049496, 8 pages.

THREE COLOR LIGHT SOURCES INTEGRATED ON A SINGLE WAFER

TECHNICAL FIELD

The present technology relates to methods of forming light sources with three different emission wavelengths on the same substrate. More specifically, the present technology relates to methods of tailoring the properties of various light sources to achieve the desired emission wavelengths.

BACKGROUND

Various display technologies use light sources with different emission wavelengths, such as red, green, and blue, to provide full-color displays. For example, light emitting diodes (LEDs) may be arranged on a display panel of a television. The LEDs may be micro-LEDs having a maximum linear dimension less than or about 10 μm. It is difficult, expensive, and time-consuming to provide LEDs having different emission wavelengths on the same substrate, and often the LEDs are not characterized by acceptable properties.

Thus, there is a need for improved methods that can be used to produce high quality LEDs having different emission wavelengths on the same substrate. These and other needs are addressed by the present technology.

SUMMARY

Exemplary devices may include a substrate, a dielectric layer formed on the substrate, a first light source configured to emit first light characterized by a first wavelength, a second light source configured to emit second light characterized by a second wavelength different from the first wavelength, and a third light source configured to emit third light characterized by a third wavelength different from the first wavelength and the second wavelength. The first light source may be natively formed on a first region of the substrate and arranged within a first opening of the dielectric layer. The second light source may be natively formed on a second region of the substrate and arranged within a second opening of the dielectric layer. The third light source may be natively formed on a third region of the substrate and arranged within a third opening of the dielectric layer.

In some embodiments, the first light source may include an emission surface having a polarity that is semi-polar and/or non-polar. The first light source may include a first active region having a first degree of relaxation, the second light source may include a second active region having a second degree of relaxation, and the first degree of relaxation may be different from the second degree of relaxation.

The first light source may include a first active region having a first percentage of In, the second light source may include a second active region having a second percentage of In, and the first percentage of In is different from the second percentage of In. The first light source may have a first shape, the second light source may have a second shape, and the first shape may be different from the second shape.

The first light source may include a first semiconductor layer including GaN and/or InGaN. The first light source may also include a first porous semiconductor layer formed on the first semiconductor layer and a first relaxed semiconductor layer formed on the first porous semiconductor layer, the first porous semiconductor layer may include GaN having a first porosity, and the first relaxed semiconductor layer may include InGaN having a first degree of relaxation.

The second light source may include a second semiconductor layer including GaN and/or InGaN, the second light source may also include a second porous semiconductor layer formed on the second semiconductor layer and a second relaxed semiconductor layer formed on the second porous semiconductor layer, the second porous semiconductor layer may include GaN having a second porosity, and the second relaxed semiconductor layer may include InGaN having a second degree of relaxation. The first porosity may be different from the second porosity, and the first degree of relaxation may be different from the second degree of relaxation.

The InGaN in the first relaxed semiconductor layer of the first light source may have a first percentage of In, the InGaN in the second relaxed semiconductor layer of the second light source may have a second percentage of In, and the first percentage of In may be different from the second percentage of In. The first light source may be characterized by a first critical dimension, the second light source may be characterized by a second critical dimension, and the first critical dimension may be different from the second critical dimension.

Some embodiments of the present technology may encompass devices having a plurality of first light sources configured to emit first light characterized by a first wavelength, a plurality of second light sources configured to emit second light characterized by a second wavelength, and a plurality of third light sources configured to emit third light characterized by a third wavelength. Each first light source of the plurality of first light sources may be natively formed on a first region of a substrate. The first wavelength may be different from the second wavelength and the third wavelength, and the second wavelength may be different from the third wavelength. Each second light source of the plurality of second light sources may be natively formed on a second region of the substrate, and each third light source of the plurality of third light sources may be natively formed on a third region of the substrate.

In some embodiments, the plurality of first light sources may be spaced to have a first distance between adjacent first light sources of the plurality of first light sources, the plurality of second light sources may be spaced to have a second distance between adjacent second light sources of the plurality of second light sources, and the first distance may be different from the second distance. Each first light source of the plurality of first light sources may be characterized by a first critical dimension, each second light source of the plurality of second light sources may be characterized by a second critical dimension, and the first critical dimension may be different from the second critical dimension.

The plurality of first light sources may be spaced to have a first distance between adjacent first light sources of the plurality of first light sources, the plurality of second light sources may be spaced to have a second distance between adjacent second light sources of the plurality of second light sources, the first distance may be greater than the second distance, and the first critical dimension may be smaller than the second critical dimension. A first number of the first light sources may be formed on the first region of the substrate, a second number of the second light sources may be formed on the second region of the substrate, the first number of the first light sources may be smaller than the second number of the second light sources, and the first critical dimension may be smaller than the second critical dimension.

The first region of the substrate may include a plurality of first portions of the substrate, the second region of the substrate may include a plurality of second portions of the substrate, and the third region of the substrate may include a plurality of third portions of the substrate. A number of the first portions of the substrate may be greater than a number of the second portions of the substrate. Each first light source of the plurality of first light sources may be characterized by a first critical dimension, each second light source of the plurality of second light sources may be characterized by a second critical dimension, and the first critical dimension may be smaller than the second critical dimension.

Some embodiments of the present technology may encompass devices having a first light source configured to emit first light characterized by a first wavelength, a second light source configured to emit second light characterized by a second wavelength, and a third light source configured to emit third light characterized by a third wavelength. The first light source may be formed on a first region of a substrate, and a first semiconductor layer of the first light source may be characterized by a first porosity. The second light source may be formed on a second region of the substrate, and a second semiconductor layer of the second light source may be characterized by a second porosity. The third light source may be formed on a third region of the substrate, and a third semiconductor layer of the third light source may be characterized by a third porosity. The first wavelength may be different from the second wavelength and the third wavelength, and the second wavelength may be different from the third wavelength. The first porosity may be different from the second porosity and the third porosity, and the second porosity may be different from the third porosity. The first light source may include an emission surface that is semi-polar and/or non-polar.

Such technology may provide numerous benefits over conventional systems and techniques. For example, the light sources may be natively formed on the same substrate, reducing costs, increasing yields, and decreasing processing times as compared with conventional pick-and-place methods. Further, the emission wavelength of each light source may be tuned. For example, challenges in providing bright red emitters may be overcome. In addition, the thickness of the template on which the emitters are formed may be reduced. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
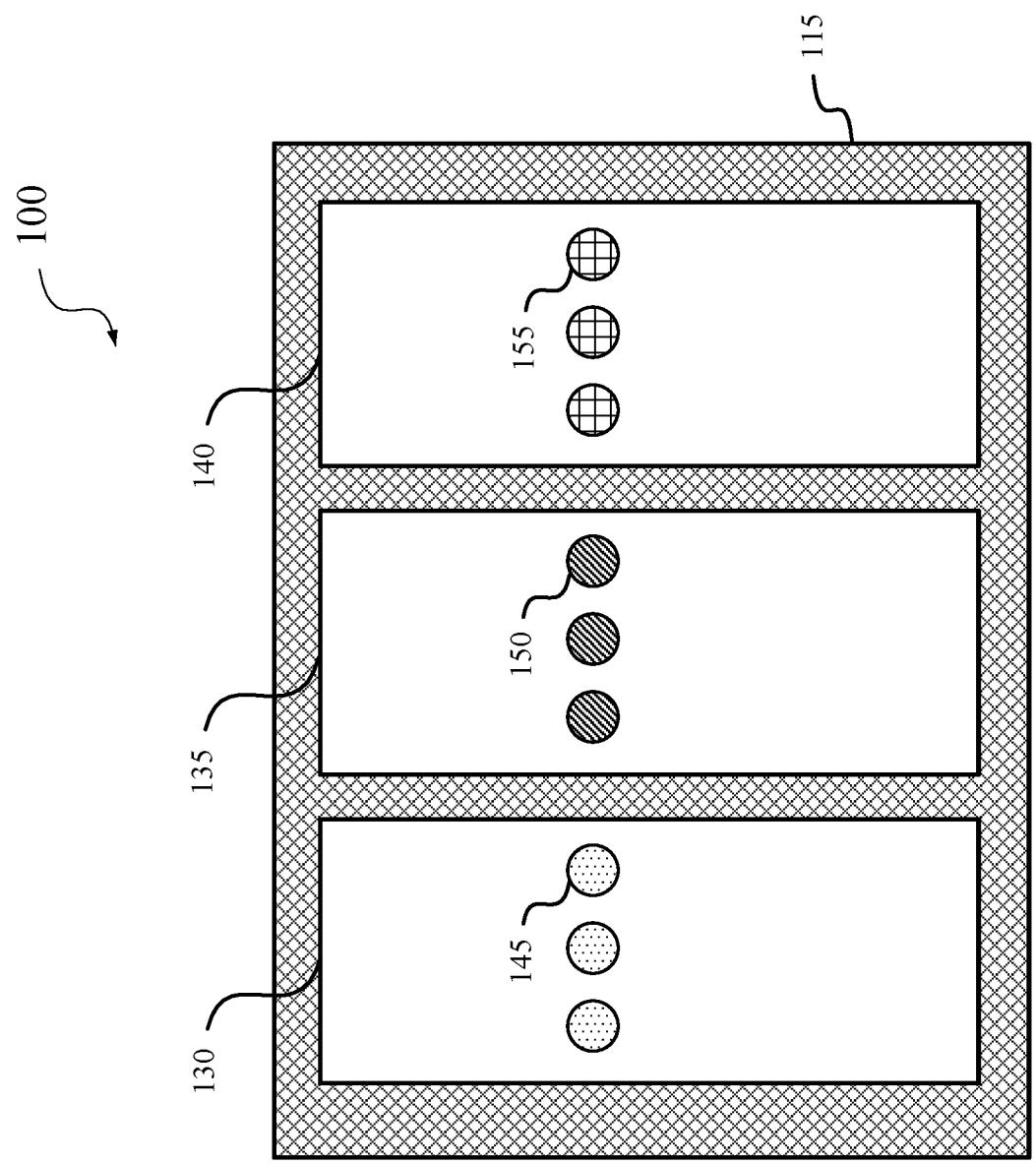
FIG. 1 shows a schematic top view of an exemplary device according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Many display technologies use light sources with different emission wavelengths, such as red, green, and blue, to provide full-color displays. The light sources are made of different materials having different bandgaps in order to generate the different emission wavelengths. Some conventional methods use a "pick-and-place" technique to provide light sources having suitable light emission characteristics for each wavelength. These methods use separate substrates to grow different LEDs for each emission wavelength, remove the LEDs from the growth substrates, and then attach the LEDs to a common wafer. These methods may minimize lattice mismatch by choosing growth substrates that have similar crystal structures to the LEDs for each emission wavelength. Lattice mismatch can induce strain in the LEDs that may adversely affect the quality and efficiency of light that is emitted by the LEDs. However, due to the number of processing steps, the increased number of starting substrates, and the complexity of the equipment, these methods are tedious, time-consuming, low-yielding, and expensive.

The present technology may overcome these issues by natively forming LEDs having different emission wavelengths on the same substrate. Various parameters may be adjusted to select specific emission wavelengths. For example, different regions of a Si-doped GaN layer that is formed on the substrate may have different amounts of porosity, which may be used to incorporate various amounts of In into corresponding regions of an InGaN layer to alter the strain of the InGaN layer and thereby shift the emission wavelengths of active regions formed on the different regions of the InGaN layer. In particular, a first region may be tuned for blue emission, while a second region may be relaxed somewhat for green emission, and a third region may be relaxed further for red emission. Light sources based on GaN may then be formed on the different regions.

Alternatively or in addition, characteristics of the light sources may be adjusted to select specific emission wavelengths. For example, the light sources may be formed to have emission surfaces that are semi-polar and/or non-polar. This may allow more In to be incorporated into the GaN-based material, which may shift the emission wavelengths to longer wavelengths. As another example, v-pits or sloped trenches may be formed on the emission surfaces to increase the In incorporation and the emission wavelengths. As yet another example, the critical dimensions of the light sources may be decreased or increased with respect to the others in order to tune (increase or decrease) the In incorporation and the emission wavelengths. As a still further example, the pitch of the light sources may be increased or decreased in order to tune (increase or decrease) the In incorporation and the emission wavelengths. As yet another example, the light sources may be formed to have facets and/or superlattices in order to alter (increase or decrease) the In incorporation and the emission wavelengths.

The methods of the present technology may also minimize strain effects that can shift the emission wavelength in an undesirable manner and/or polarization effects that can reduce the intensity of the light emission. Further, the methods of the present technology may reduce the thickness of the LEDs. In addition, the methods of the present technology may reduce the number of processing and/or masking steps that are used to form the LEDs.

FIG. 1 shows a schematic top view of an exemplary device 100 according to some embodiments of the present technology. The device 100 may include a plurality of light sources 145, 150, and 155 that are natively formed on a substrate 115. The substrate 115 may include Si. More specifically, the substrate 115 may include a first region 130 on which first light sources 145 that are configured to emit light having a first wavelength are formed, a second region 135 on which second light sources 150 that are configured to emit light having a second wavelength are formed, and a third region 140 on which third light sources 155 that are configured to emit light having a third wavelength are formed. In some examples, the first wavelength may fall within the red region of the electromagnetic spectrum, the second wavelength may fall within the green region of the electromagnetic spectrum, and the third wavelength may fall within the blue region of the electromagnetic spectrum. The red region may include wavelengths between about 615 nm and about 740 nm, the green region may include wavelengths between about 500 nm and about 565 nm, and the blue region may include wavelengths between about 450 nm and about 485 nm. For simplicity, only a few first light sources 145, second light sources 150, and third light sources 155 are shown in FIG. 1. However, any suitable number of first light sources 145, second light sources 150, and third light sources 155 may be provided.

Figure 2:
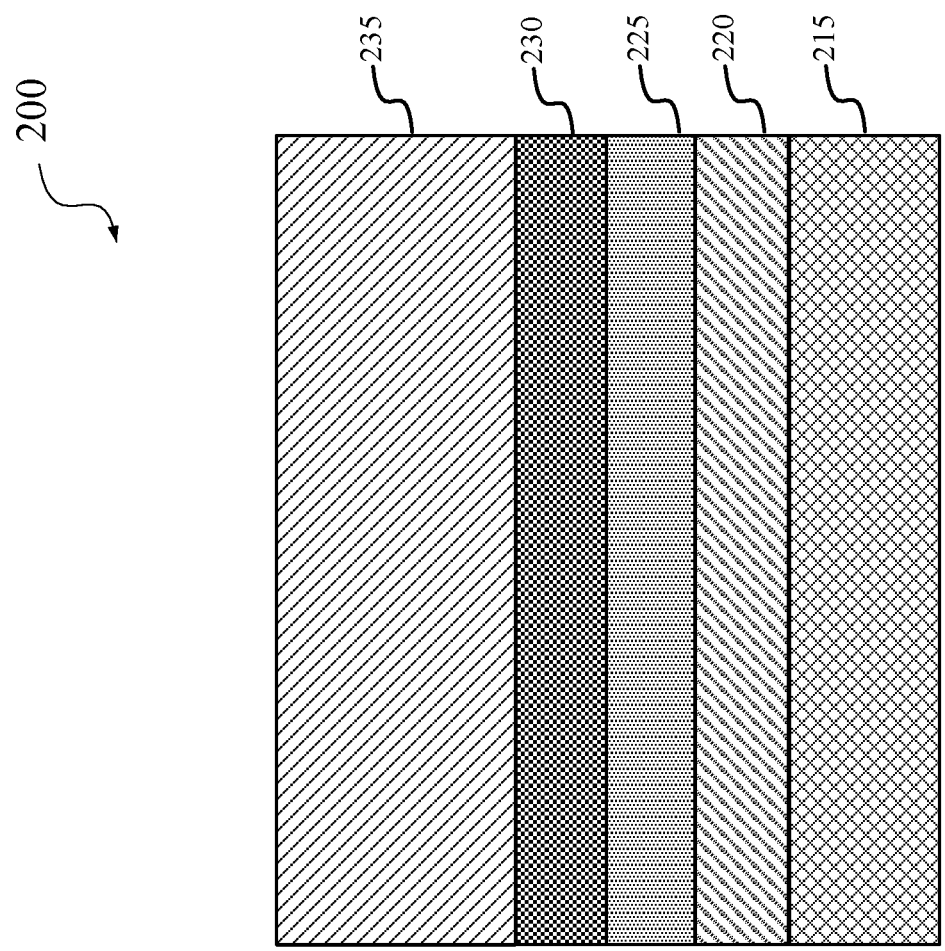
FIG. 2 shows a side view of an exemplary light source according to some embodiments of the present technology.

FIG. 2 shows a side view of an exemplary light source 200 according to some embodiments of the present technology. The light source 200 includes an active region 235 that may have a multiple quantum well (MQW) structure of GaN and/or InGaN plus the p- and n-doped GaN or InGaN on opposite sides of the MQW, and a semiconductor layer 220 that is deposited on a substrate 215. For simplicity, contacts, reflectors, and passivation layers are not shown. In some examples, the semiconductor layer 220 may include GaN and the substrate 215 may include Si, although the substrate may also be or include other silicon-containing materials as well as any other material on which a semiconductor layer can be formed. The emission wavelength of the light source 200 may be affected by the concentration of Indium in the MQW of the active region 235 and by the strain on the active region 235 due to the lattice mismatch relative to the substrate 215 and the semiconductor layer 220. The emissive power or brightness of the light source 200 per unit input electrical power is also limited by the strain and defect traps within the active region 235 and on its surfaces. As one example to reduce such limitations, the light source 200 may also include a porous semiconductor layer 225 that is formed on the semiconductor layer 220. In some examples, the porous semiconductor layer 225 may include porous Si-doped GaN. In addition, the light source 200 may include a relaxed semiconductor layer 230 that is formed on the porous semiconductor layer 225. In some examples, the relaxed semiconductor layer 230 may include relaxed InGaN.

The emission wavelength of the light source 200 may then be selected by changing the degree of porosity of the porous semiconductor layer 225. For example, the degree of porosity may be increased by removing increasing amounts of Si from the Si-doped GaN of the porous semiconductor layer 225. This allows the relaxed semiconductor layer 230 to assume a more natural lattice size (more relaxed) at a higher level of In that is closer to that in the MQW. The emission wavelength arising from the specific indium concentration of the MQW of the active region 235 is then less affected by the strain imparted by the layers and substrate underneath; this results in a longer emission wavelength from the light source 200.

In some examples, the emission wavelength of the light source 200 may be varied to provide the first light sources 145, the second light sources 150, and the third light sources 155 shown in FIG. 1. For example, the first light sources 145 on the first region 130 of the substrate 115 may include a porous semiconductor layer 225 with a high degree of porosity, such as between 30% and 60% porosification. The second light sources 150 on the second region 135 of the substrate 115 may include a porous semiconductor layer 225 with a medium degree of porosity, such as between 0% and 30% porosification. The third light sources on the third region 140 of the substrate 115 may include a porous semiconductor layer 225 with a low degree of porosity, such as 0% porosification. This may result in the first light sources 145 on the first region 130 of the substrate 115 having a relaxed semiconductor layer 230 with a high degree of relaxation and/or a high degree of In incorporation, such as between 5% and 15% In, the second light sources 150 on the second region 135 of the substrate 115 having a relaxed semiconductor layer 230 with a medium degree of relaxation and/or a medium degree of In incorporation, such as between 2% and 5% In, and the third light sources 155 on the third region 140 of the substrate having a relaxed semiconductor layer 230 with a low degree of relaxation and/or a low degree of In incorporation, such as between 1% and 5% In.

The device 100 shown in FIG. 1 may be formed by uniformly depositing the semiconductor layer 220 on the substrate 115, and then uniformly depositing the porous semiconductor layer 225 on the semiconductor layer 220. The semiconductor layer 220 and the porous semiconductor layer 225 may be deposited by various methods, such as metal-organic chemical vapor deposition (MOCVD), plasma-enhanced MOCVD, molecular beam epitaxy (MBE), or vapor-phase epitaxy. In some examples, the degree of porosity of the porous semiconductor layer 225 may then be adjusted differently in regions corresponding to the first region 130 of the substrate 115, the second region 135 of the substrate 115, and the third region 140 of the substrate 115.

For example, in order to increase the porosity of the porous semiconductor layer 225 as initially deposited, various amounts of Si may be removed from the porous Si-doped GaN of the porous semiconductor layer 225. In some examples, a first amount of Si may be removed by an electrochemical process from the portion of the porous semiconductor layer 225 formed on the first region 130 of the substrate 115, a second amount of Si may be removed from the portion of the porous semiconductor layer 225 formed on the second region 135 of the substrate 115, and a third amount of Si may be removed from the portion of the porous semiconductor layer 225 formed on the third region 140 of the substrate 115. The first amount of Si that is removed may be greater than the second amount of Si that is removed, and the second amount of Si that is removed may be greater than the third amount of Si that is removed. The relaxed semiconductor layer 230 may then be deposited on the porous semiconductor layer 225. Due to the differences in porosity of the porous semiconductor layer 225, the different regions of the relaxed semiconductor layer 230 may have corresponding differences in strain. In this example, the portion of the relaxed semiconductor layer 230 corresponding to the first region 130 of the substrate 115 may have a greater degree of relaxation of strain than the portion of the relaxed semiconductor layer 230 corresponding to the second region 135 of the substrate 115. This also has the effect of red-shifting the emission wavelength, such that light sources formed on the first region 130 of the substrate 115 may have a longer emission wavelength than light sources formed on the second region 135 of the substrate 115. Likewise, the portion of the relaxed semiconductor layer 230 corresponding to the second region 135 of the substrate 115 may have a greater degree of relaxation of strain than the portion of the relaxed semiconductor layer 230 corresponding to the third region 140 of the substrate 115. Further, light sources formed on the second region 135 of the substrate 115 may have a longer emission wavelength than light sources formed on the third region 140 of the substrate 115. In other examples, at least one of the portions of the porous semiconductor layer 225 may remain as deposited, such that its porosity is unchanged. The light sources may include the active region 235, which may be formed by deposition on the different regions of the relaxed semiconductor layer 230.

Figure 3:
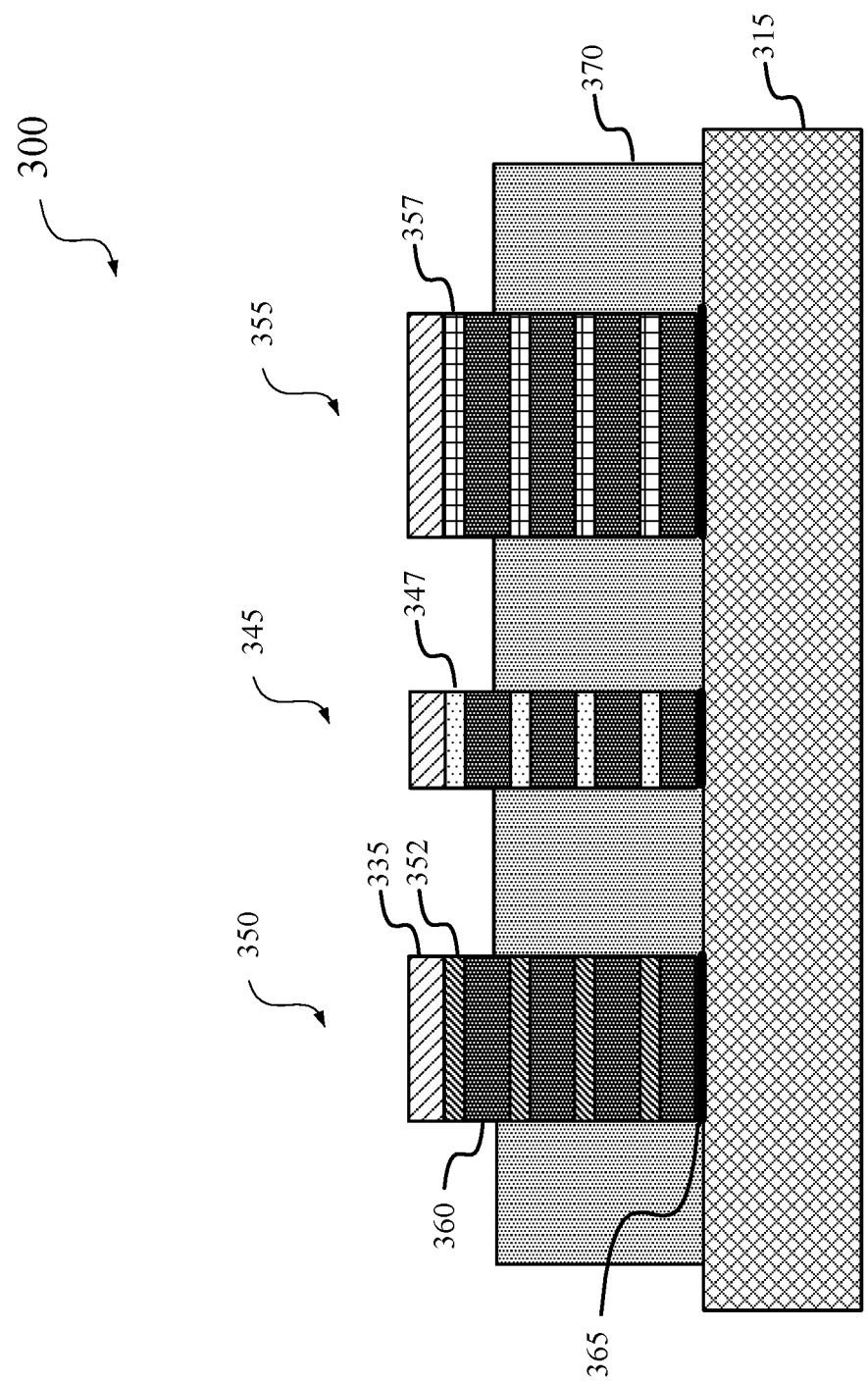
FIG. 3 shows a schematic side view of an exemplary device according to some embodiments of the present technology.

FIG. 3 shows a schematic side view of an exemplary device 300 according to some embodiments of the present technology. The device 300 may include a first light source 345, a second light source 350, and a third light source 355, each of which is natively formed on a substrate 315. The substrate 315 may include Si, although the substrate may also be or include other silicon-containing materials as well as any other material on which a semiconductor layer can be formed. The first light source 345 may be configured to emit light having a first wavelength, the second light source 350 may be configured to emit light having a second wavelength, and the third light source 355 may be configured to emit light having a third wavelength. In some examples, the first wavelength may fall within the red region of the electromagnetic spectrum, the second wavelength may fall within the green region of the electromagnetic spectrum, and the third wavelength may fall within the blue region of the electromagnetic spectrum.

The device 300 may be formed by depositing a dielectric layer 370 on the substrate 315. The dielectric layer 370 may include a material such as SiN, and may have a thickness of less than or about 0.50 μm, less than or about 0.45 μm, less than or about 0.40 μm, less than or about 0.35 μm, or less. In some examples, the dielectric layer 370 may be deposited uniformly on the substrate 315, and then sub-micron to few-micron diameter sized openings may be etched within the dielectric layer 370 down to the surface of the substrate 315, for an effective depth that could vary from half the opening size to three times the opening size. In some examples, the light sources 345, 350, and 355 may be selectively deposited on the substrate 315 within these openings within the dielectric layer 370, but not on the dielectric layer 370. This selective deposition within small and deep openings may reduce the thickness of the layers between the substrate 315 and an active region 335 that would have otherwise been needed (when done over larger and shallower dimensions) to reduce defect traps and increase relaxation for optimum material quality and emissive power.

Each of the first light source 345, the second light source 350, and the third light source 355 has a critical dimension that may also be adjusted to allow for higher In incorporation and relaxation in the MQW of the active region 335, and thus to select the emission wavelength. In this example, the critical dimension may be the diameter of the respective opening in the dielectric layer 370 ("critical diameter"). In other examples, the critical dimension may be the aspect ratio (height to diameter ratio) of the selectively deposited light source 345, 350, or 355. The diameter of the first light source 345 may be between about 200 nm and about 400 nm, the diameter of the second light source 350 may be between about 400 nm and about 800 nm, and the diameter of the third light source 355 may be between about 400 nm and about 800 nm. More generally, the first light source 345 may have a diameter that is smaller than the diameters of the second light source 350 and the third light source 355. Further, the diameters of the second light source 350 and the third light source 355 may be equal, or the diameter of the second light source 350 may be smaller than the diameter of the third light source 355. For each of the first light source 345, the second light source 350, and the third light source 355, the light source diameter and/or the concentration of In supplied during the selective deposition of the respective active regions may be adjusted to provide a light source having a particular emission wavelength. For example, higher concentration of In may be supplied during deposition of the active region 335 in order to increase the emission wavelength. Further, the diameter of the light source may be decreased in order to increase the emission wavelength.

Each of the first light source 345, the second light source 350, and the third light source 355 may in one example be formed to include a set of analogous layers to the semiconductor layer 220, the porous semiconductor layer 225, and the relaxed semiconductor layer 230 below the active region 335. In other examples where the corresponding porous semiconductor layer 225 and the relaxed semiconductor layer 230 are not included, these two layers may be the same as the semiconductor 220, or in some other examples InGaN may replace GaN or be added on top of the semiconductor layer 220, and further in some other examples alternating layers of GaN and InGaN ("alternating stack") may be used. For example, the first light source 345 may include alternating layers of a first semiconductor layer 360 and a second semiconductor layer 347, where the first semiconductor layer 360 includes GaN and the second semiconductor layer 347 includes InGaN. Similarly, the second light source 350 may include alternating layers of the first semiconductor layer 360 and a second semiconductor layer 352, where the first semiconductor layer 360 includes GaN and the second semiconductor layer 352 includes InGaN. Likewise, the third light source 355 may include alternating layers of the first semiconductor layer 360 and a second semiconductor layer 357, where the first semiconductor layer 360 includes GaN and the second semiconductor layer 357 includes InGaN. However, the second light source 350 may not include the semiconductor layer 352, and may only include the first semiconductor layer 360. Alternatively or in addition, the third light source 355 may not include the semiconductor layer 357, and may only include the first semiconductor layer 360. In some examples, the top of the second semiconductor layer 347 of the first light source 345, the top of the second semiconductor layer 352 of the second light source 350, and/or the top of the second semiconductor layer 357 of the third light source 355 may be formed to extend above the top of the dielectric layer 370 by less than or about 0.60 µm, less than or about 0.50 µm, less than or about 0.40 µm, less than or about 0.30 µm, less than or about 0.20 µm, less than or about 0.10 µm, or less.

In some examples, a seed layer 365 may be deposited on the surface of the substrate 315 within the openings in the dielectric layer 370. The seed layer 365 may include AlN and/or HfN, and may have a thickness between about 20 nm and about 30 nm. The seed layer 365 may prevent Ga in a first semiconductor layer 360 from reacting with Si in the substrate 315. Layers of the first light source 345, the second light source 350, and the third light source 355 may then be deposited on the seed layer 365 within the openings in the dielectric layer 370. The first semiconductor layer 360 may be the same for the first light source 345, the second light source 350, and the third light source 355. In the alternating stack example where the first semiconductor layer 360 alternates with the second semiconductor layers 347, 352, and 357, the bottommost first semiconductor layer 360 may have a thickness less than or about 300 nm, less than or about 250 nm, less than or about 200 nm, less than or about 150 nm, or less. Each of the remaining layers within the alternating stack may have a thickness between about 50 nm and about 100 nm. The InGaN layers of the second semiconductor layer 347 of the first light source 345, the second semiconductor layer 352 of the second light source 350, and the second semiconductor layer 357 of the third light source 355 may have different concentrations of In in order to provide different degrees of strain relaxation. For example, the second semiconductor layer 347 of the first light source 345 may have an In concentration between about 0.25 and about 0.3. Further, the second semiconductor layer 352 of the second light source 350 may have an In concentration between about 0.14 and about 0.18. In addition, the second semiconductor layer 357 of the third light source 355 may have an In concentration between about 0.05 and about 0.08.

In some examples, a superlattice stack of alternating thinner layers of GaN and InGaN may be included just below the MQW within the n-doped layer of the active region 335 either to further relieve strain on the MQW or when the alternating stack of 50 nm to 100 nm layers is not used. The alternating layers of GaN and InGaN in the superlattice may be thinner than the alternating layers in the MQW of the active region 335. The concentration of Indium in the InGaN layers of the superlattice may also be lower than the Indium in the InGaN layers of the MQW. For example, each of the alternating layers of GaN and InGaN in the MQW may have a thickness between about 2 nm and about 15 nm, while those in the superlattice may have a thickness between about 1 nm and about 5 nm. The polarity of the surface of the active region 335 may reduce the intensity of the light emission.

Figure 4:
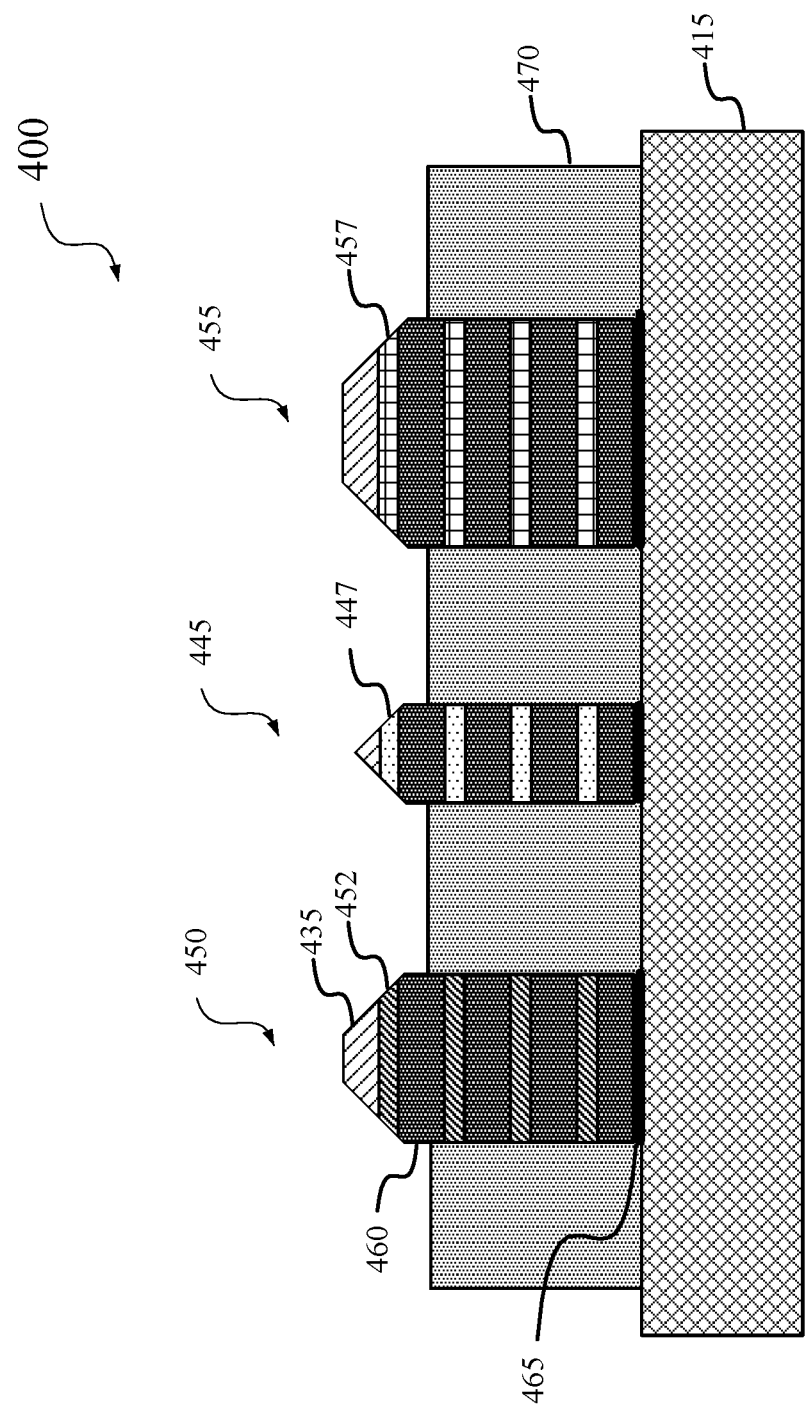
FIG. 4 shows a schematic side view of an exemplary device according to some embodiments of the present technology.

FIG. 4 shows a schematic side view of an exemplary device 400 according to some embodiments of the present technology. The device 400 may include a first light source 445, a second light source 450, and a third light source 455, each of which is natively formed on a substrate 415 within openings in a dielectric layer 470. The first light source 445, the second light source 450, and the third light source 455 may be formed in a similar manner and may have similar characteristics as the first light source 345, the second light source 350, and the third light source 355 shown in FIG. 3. For example, the first light source 445 may include alternating layers of a first semiconductor layer 460 and a second semiconductor layer 447 that are similar to the first semiconductor layer 360 and the second semiconductor layer 347 of the first light source 345. Similarly, the second light source 450 may include alternating layers of the first semiconductor layer 460 and a second semiconductor layer 452 that are similar to the first semiconductor layer 360 and the second semiconductor layer 352 of the second light source 350. Likewise, the third light source 455 may include alternating layers of the first semiconductor layer 460 and a second semiconductor layer 457 that are similar to the first semiconductor layer 360 and the second semiconductor layer 357 of the third light source 355. In some examples, a seed layer 465 may be deposited on the surface of the substrate 415 within the openings in the dielectric layer 470. The seed layer 465 may be similar to the seed layer 365 shown in FIG. 3.

In the example shown in FIG. 4, polarization effects may be reduced by forming facets at the corners of an active region 435, such that the active region 435 has a trapezoidal shape. In some examples, the facets may be formed to have non-polar or semi-polar surfaces. The second light source 450 and the third light source 455 are examples of light sources having an active region 435 with a trapezoidal shape. Further, the facets may continue into the underlying second semiconductor layer 452 of the second light source 450, the second semiconductor layer 457 of the third light source 455, and/or the first semiconductor layer 460, as well the superlattice stack when included just below the MQW of the active region 435. Alternatively, polarization effects may be reduced by forming facets at the corners of the active region 435, such that the active region 435 has a pyramidal shape. The facets may be formed to have non-polar or semi-polar surfaces. The first light source 445 is an example of a light source having an active region 435 with a pyramidal shape. The active region 435 of the first light source 445 may use the sloped sides of the pyramidal shape as the emission surfaces. Further, the facets may continue into the underlying second semiconductor layer 447 and/or first semiconductor layer 460 of the first light source 445. As in the previous example of FIG. 3, the light source critical dimension and supply of In during deposition of the active region 435 may be adjusted to select the emission wavelength of the facetted active region 435.

Figure 5:
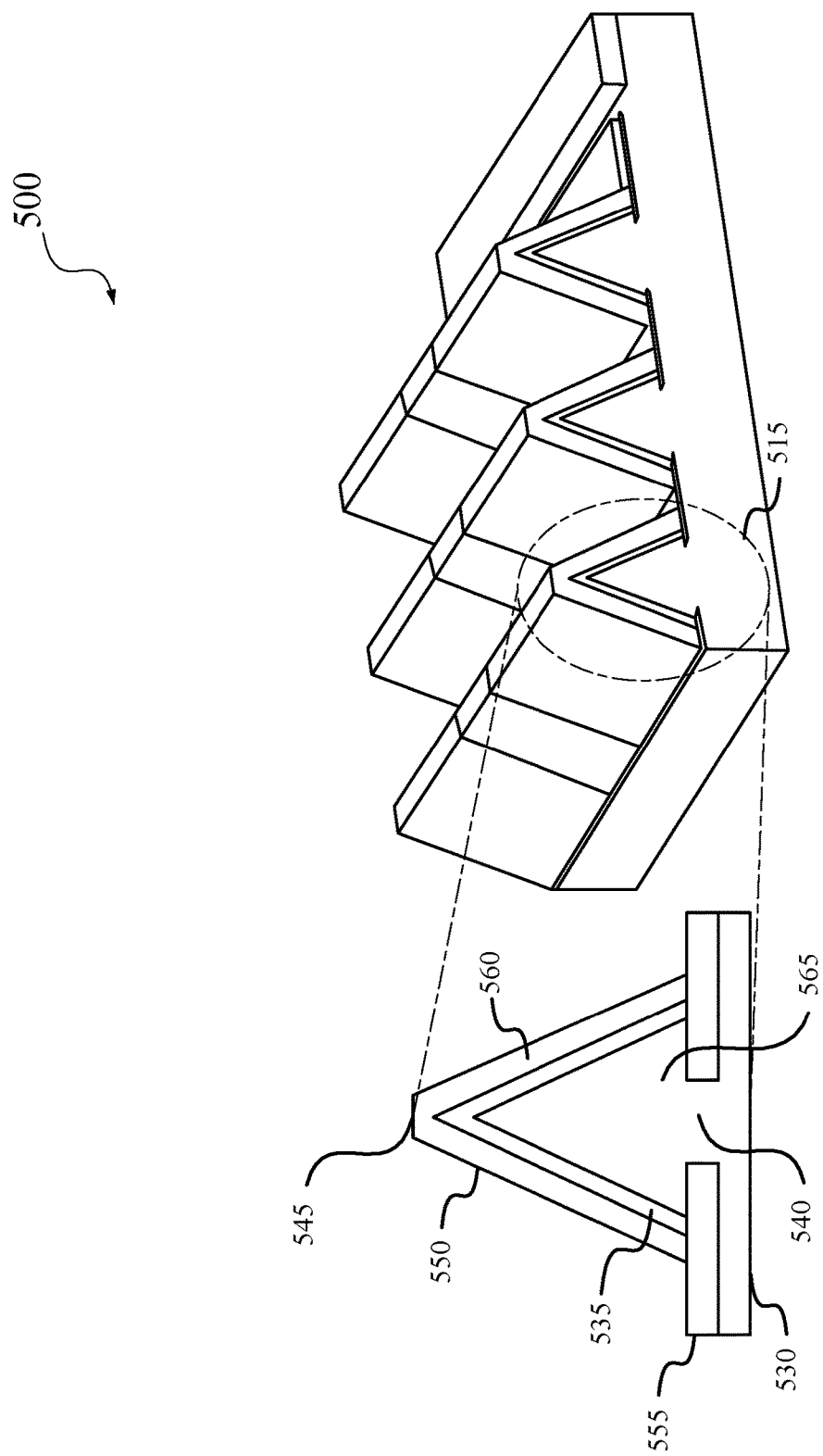
FIG. 5 shows a perspective view of an exemplary device according to some embodiments of the present technology.

The dimension of the exemplary light sources in the direction perpendicular to the plane shown in FIGS. 4 and 5 (i.e. perpendicular to the cross-section or critical dimension) may in some examples be the same as the selected critical diameter. In such cases the shape of the light sources as viewed from the top is either a square or a circle as in FIG. 1. The three-dimensional shapes of the light sources may then be any of the following: a square or circular mesa when the height extension above the dielectric is less than or slightly greater than the critical dimension or diameter; a square or circular rod when the height extension above the dielectric is at least two to three times that of the critical dimension; and versions of these mesas and rods with either a trapezoidal or pyramidal top when facetted (instead of flat) as in FIG. 4. In some examples however, the light source dimension perpendicular to the critical dimension is longer, so that the three-dimensional shape of the light source is a stripe mesa or a fin depending on the height extension above the dielectric, and either case could also have a trapezoidal or pyramidal top instead of a flat top.

FIG. 5 shows a perspective view of an exemplary device 500 according to some embodiments of the present technology. In the example shown in FIG. 5, the device 500 may include a plurality of light sources 515, each of which has a shape that may be a stripe pyramid. Each of the light sources 515 may include a first emission surface 545 that is a polar surface. Further, each of the light sources 515 may include a plurality of second emission surfaces 550 that are semi-polar or non-polar surfaces. Using semi-polar or non-polar surfaces may allow more In to be incorporated into the emission surfaces, which may increase the emission wavelength of the light source 515. Further, using semi-polar or non-polar surfaces may reduce strain and polarization effects, which can change the emission wavelength in an undesirable and/or unpredictable way. In the example shown in FIG. 5, the second emission surfaces 550 may be a (1 0–1 1) surface that is semi-polar. The active region in each of the light sources 515 may include the multiple quantum well (MQW) structure 535 of GaN and/or InGaN, a p-type GaN layer 560, and an n-type GaN layer 565. Not shown are the contact layers, reflectors, and passivation layers.

The light sources 515 shown in FIG. 5 may be grown on a semiconductor layer 530. The semiconductor layer 530 may include GaN and/or InGaN as discussed in relation to FIGS. 3 and 4. Alternatively, the light sources 515 may be grown on the relaxed semiconductor layer 230 that is formed on the porous semiconductor layer 225 of the light source 200 shown in FIG. 2. The supply of In during deposition of the active region and in any InGaN layer below the active region may be adjusted to select the emission wavelength of the light source 515. As shown in FIG. 5, each light source 515 may be built within openings 540 of a dielectric material 555 such as silicon nitride. The opening 540 in the dielectric material 555 may be an example of a critical dimension of the light source 515. Changing the size of the opening 540 may also change the size of the pyramidal structure, because the pyramidal structure has a width that is greater than or equal to the size of the opening 540. This may change the amount of In that is incorporated into the pyramidal structure, thereby changing the emission wavelength of the light source 515. For example, in order to increase the emission wavelength, the size of the opening 540 may be decreased, which increases the amount of In incorporation. On the other hand, in order to decrease the emission wavelength, the size of the opening 540 may be increased, which decreases the amount of In incorporation. Thus, by adjusting any combination of the stripe pyramid light source parameters affecting the MQW Indium concentration and strain level on the active region, such as the semiconductor layers underneath, supply of In during growth, the stripe pyramid width and faceting, it may be possible to achieve a larger wavelength shift and a higher quality output beam.

Figure 6:
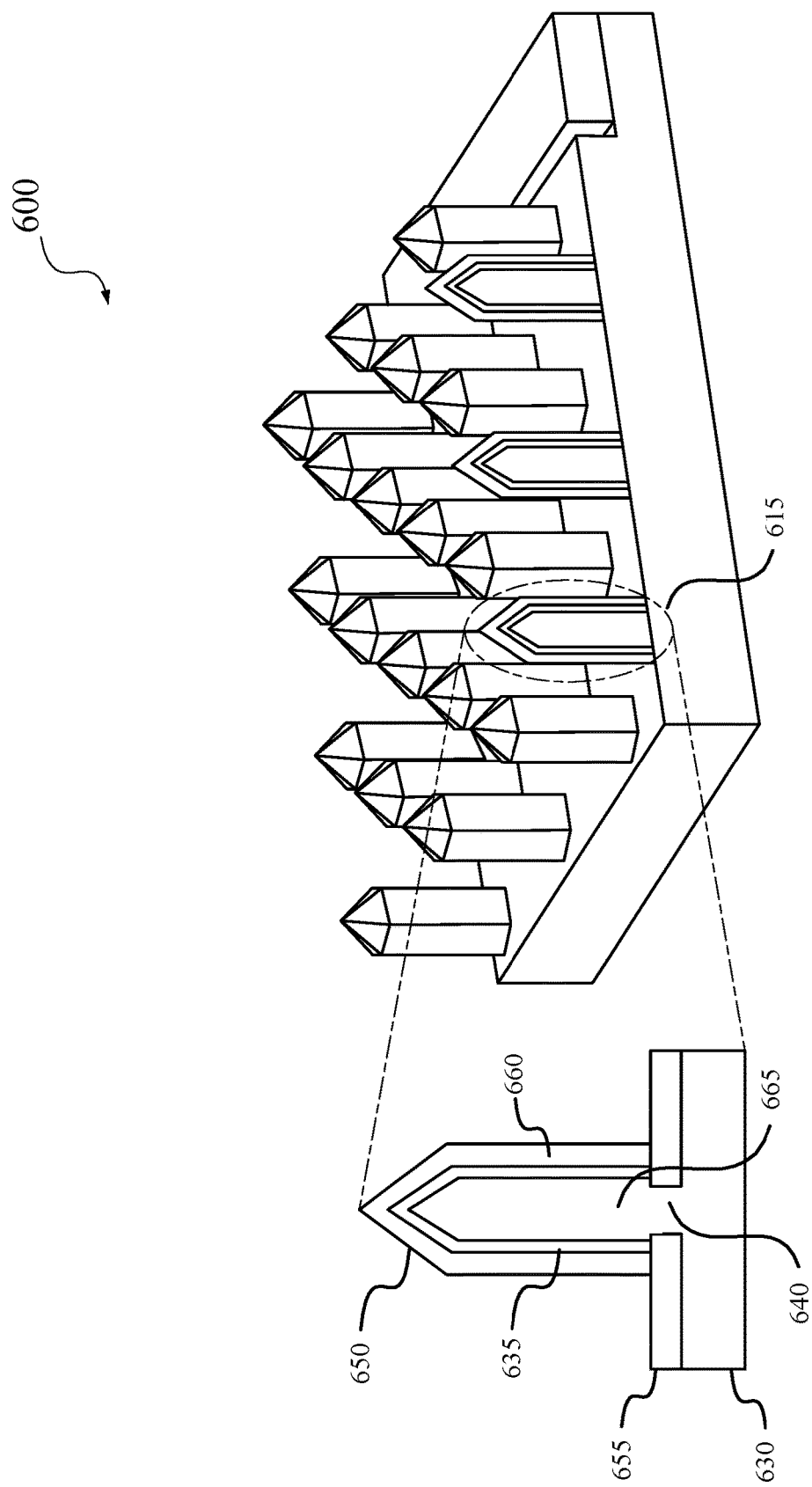
FIG. 6 shows a perspective view of an exemplary device according to some embodiments of the present technology.

FIG. 6 shows a perspective view of an exemplary device 600 according to some embodiments of the present technology. In the example shown in FIG. 6, the device 600 may include a plurality of light sources 615, each of which has a vertical rod or wire shape. The active region in each of the light sources 615 may include a multiple quantum well (MQW) structure 635 of GaN and/or InGaN, a p-type GaN layer 660, and an n-type GaN layer 665. Not shown are the contact layers, reflectors, and passivation layers. The active region of the light sources 615 shown in FIG. 6 may be grown on a semiconductor layer 630 from within an opening 640 of a dielectric layer 655 such as silicon nitride. The semiconductor layer 630 may include GaN and/or InGaN. The size of the opening 640 of the dielectric layer 655 and the diameter of the light source 615 may be adjusted to change the amount of In that is incorporated into the both the MQW structure 635 and the semiconductor layer 630 of the vertical rod or wire, thereby changing the emission wavelength of the light source 615. The height of the active region may extend above the dielectric layer 655 by three to five times the size of the opening 640 of the dielectric layer 655. Such a high aspect ratio of the structure may allow for further strain relaxation. Each of the light sources 615 may include a plurality of emission surfaces 650 that are semi-polar or non-polar surfaces. Using semi-polar or non-polar surfaces may allow more In to be incorporated into the emission surfaces, which may increase the emission wavelength of the light source 615. Further, using semi-polar or non-polar surfaces may reduce strain and polarization effects, which can change the emission wavelength in an undesirable and/or unpredictable way. In the example shown in FIG. 6, the second emission surfaces 650 may be a (1 0 –1 1) surface that is semi-polar. Thus by adjusting any combination of the rod or wire light source parameters affecting the MQW Indium concentration and strain level on the active region, such as the semiconductor layers underneath, supply of In during growth, the dielectric opening size and the diameter of the rod or wire, the height extension above the dielectric, and the polarity of the emission surfaces, it may be possible to achieve a larger wavelength shift and a higher quality output beam.

Figure 7:
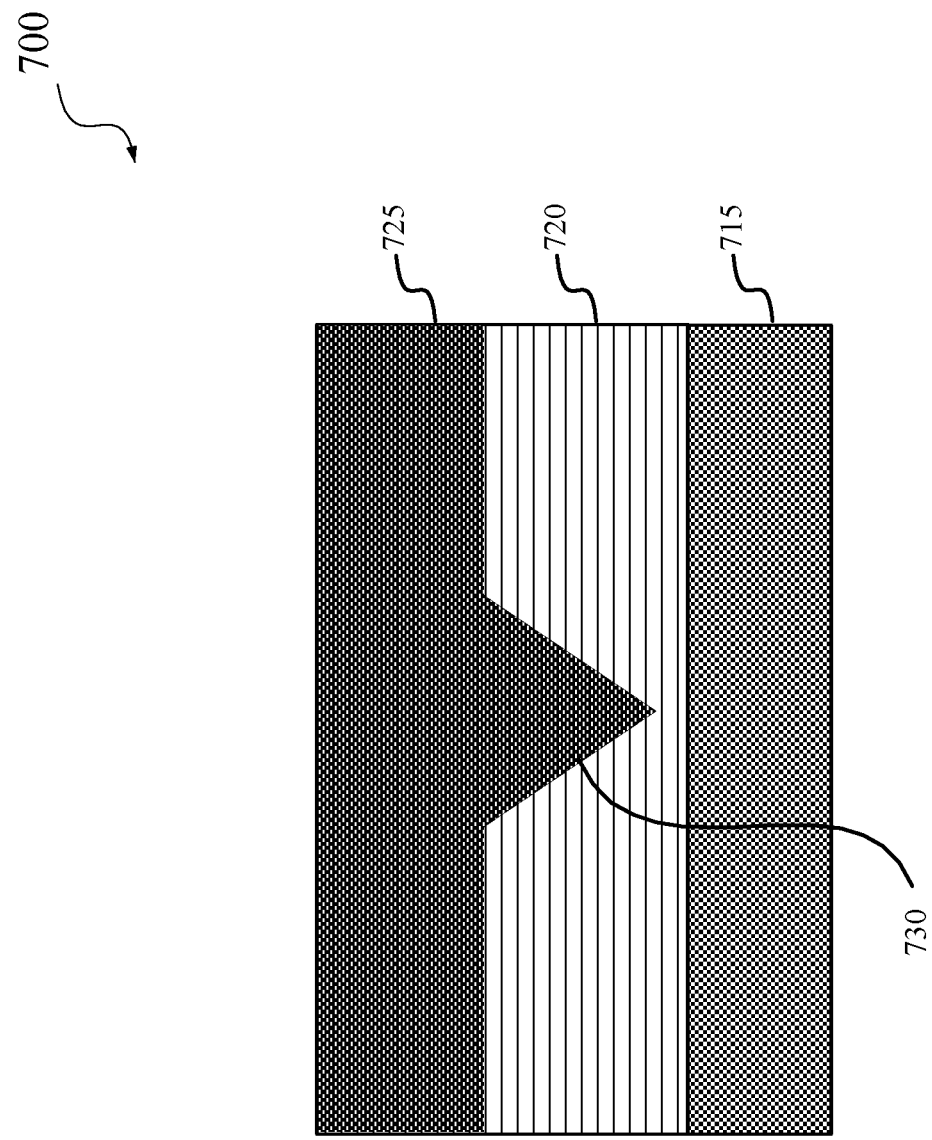
FIG. 7 shows a schematic side view of a p-n junction having a v-pit according to some embodiments of the present technology.

FIG. 7 shows a schematic side view of a p-n junction 700 having a v-pit according to some embodiments of the present technology. The p-n junction 700 may include a first semiconductor layer 715, an active region 720, and a second semiconductor layer 725. The first semiconductor layer 715 may include p-type GaN and the second semiconductor layer 725 may include n-type GaN. The active region 720 may be a multiple quantum well (MQW) layer that includes GaN and/or InGaN. A v-pit 730 may be formed within the active region 720. For example, the v-pit 730 may be formed by delaying the growth of the active region 720 at one location but continuing the growth of the active region 720 at another location. The growth may be delayed by adjusting the temperature, pressure, flow rate, and/or precursors during growth. Incorporating the v-pit 730 into the active region 720 may increase the emission wavelength.

In some examples, a plurality of v-pits 730 may be incorporated in order to select the emission wavelength of a light source. A plurality of v-pits 730 may be formed on emission surfaces that are semi-polar and/or non-polar. In one example, a plurality of v-pits 730 may be formed on the second emission surfaces 550 of the light sources 515 shown in FIG. 5. In another example, a plurality of v-pits 730 may be formed on the emission surfaces 650 of the light sources 615 shown in FIG. 6. However, the formation of v-pits 730 is not limited to semi-polar or non-polar emission surfaces, and may instead be formed on polar emission surfaces. For example, a plurality of v-pits 730 may be formed on the top surface of the active region 335 shown in FIG. 3. Forming the v-pits 730 may be used in combination with some or all of the other techniques discussed above to further increase the emission wavelength.

Figure 8:
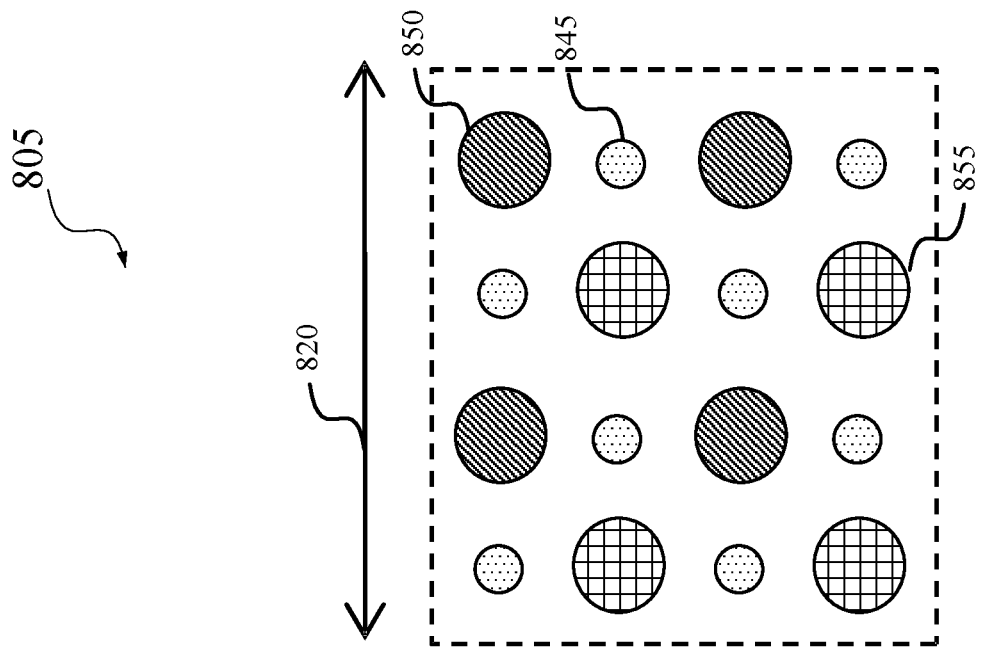
FIG. 8 shows a schematic top view of a first exemplary device and a second exemplary device according to some embodiments of the present technology.
Figure 8:
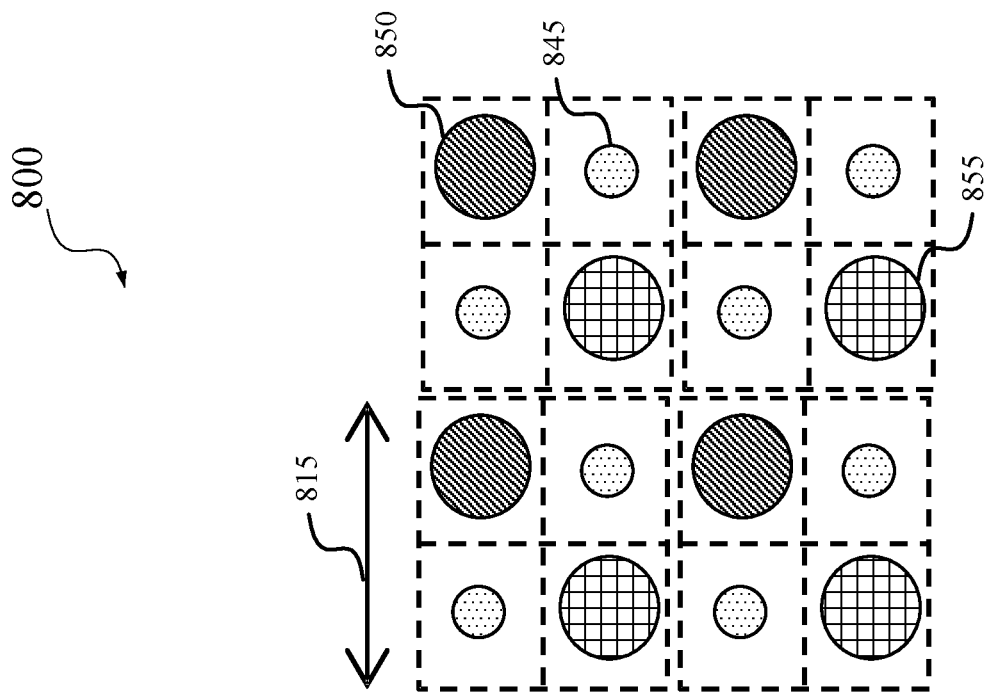

FIG. 8 shows a schematic top view of a first exemplary device 800 and a second exemplary device 805 according to some embodiments of the present technology. The first device 800 and the second device 805 may include a plurality of light sources 845, 850, and 855 that are natively formed on a substrate. The first light sources 845 may be configured to emit light having a first wavelength, the second light sources 850 may be configured to emit light having a second wavelength, and the third light sources 855 may be configured to emit light having a third wavelength. In some examples, the first wavelength may fall within the red region of the electromagnetic spectrum, the second wavelength may fall within the green region of the electromagnetic spectrum, and the third wavelength may fall within the blue region of the electromagnetic spectrum.

The first device 800 may include four dies, each of which includes two first light sources 845, one second light source 850, and one third light source 855. Each die within the first device 800 may have a square shape that has a linear dimension 815 of about 1 µm. The second device 805 may include one die that includes eight first light sources 845, four second light sources 850, and four third light sources 855. The die within the second device 805 may have a square shape that has a linear dimension 820 of about 2 µm. The linear dimension 820 may be less than or about 5 µm, less than or about 4 µm, less than or about 3 µm, or less than or about 2 µm to meet the desired standards for micro-LEDs.

The critical dimensions of the first light sources 845, the second light sources 850, and the third light sources 855 may be selected to produce the emission wavelengths discussed above. For example, the critical dimensions may be reduced in order to increase the In incorporation and the emission wavelength. The diameters of the light sources may be an example of the critical dimensions. In some examples, the diameters of the first light sources 845, the second light sources 850, and the third light sources 855 may be between about 50 nm and about 1000 nm. More specifically, in some examples, the diameters of the first light sources 845 may be about 300 nm, while the diameters of the second light sources 850 and the third light sources 855 may be about 500 nm. In other examples, the diameters of the first light sources 855 may be smaller than the diameters of the second light sources 850 and the third light sources 855, while the diameters of the second light sources 850 may be the same as or smaller than the diameters of the third light sources 855.

Further, the number of the first light sources 845, the second light sources 850, and the third light sources 855 may be selected such that the total emission area for each emission wavelength within a die is approximately the same. For example, the total emission area of the first light sources 845 may be within ±5%, ±10%, ±15%, ±20%, or ±25% of the total emission area of the second light sources 850. Similarly, the total emission area of the first light sources 845 may be within ±5%, ±10%, ±15%, ±20%, or ±25% of the total emission area of the third light sources 855. Likewise, the total emission area of the second light sources 845 may be within ±5%, ±10%, ±15%, ±20%, or ±25% of the total emission area of the third light sources 855. In the example shown in FIG. 8, there may be two first light sources 845 for each second light source 850, and two first light sources 845 for each third light source 855, due to the smaller diameter of the first light sources 845 as compared with the diameters of the second light sources 850 and the third light sources 855. In other examples, such as a 5 µm×5 µm die, there may be between 8 and 42 first light sources 845, between 3 and 6 second light sources 850, and 2 or 3 third light sources 855. Alternatively or in addition, the first light sources 845, the second light sources 850, and the third light sources 855 may be arranged in order to provide sufficient space for contacts to provide electrical connections to the first light sources 845, the second light sources 850, and the third light sources 855, and/or to provide sufficient space for reflectors to increase the efficiency of the light collection.

Figure 9:
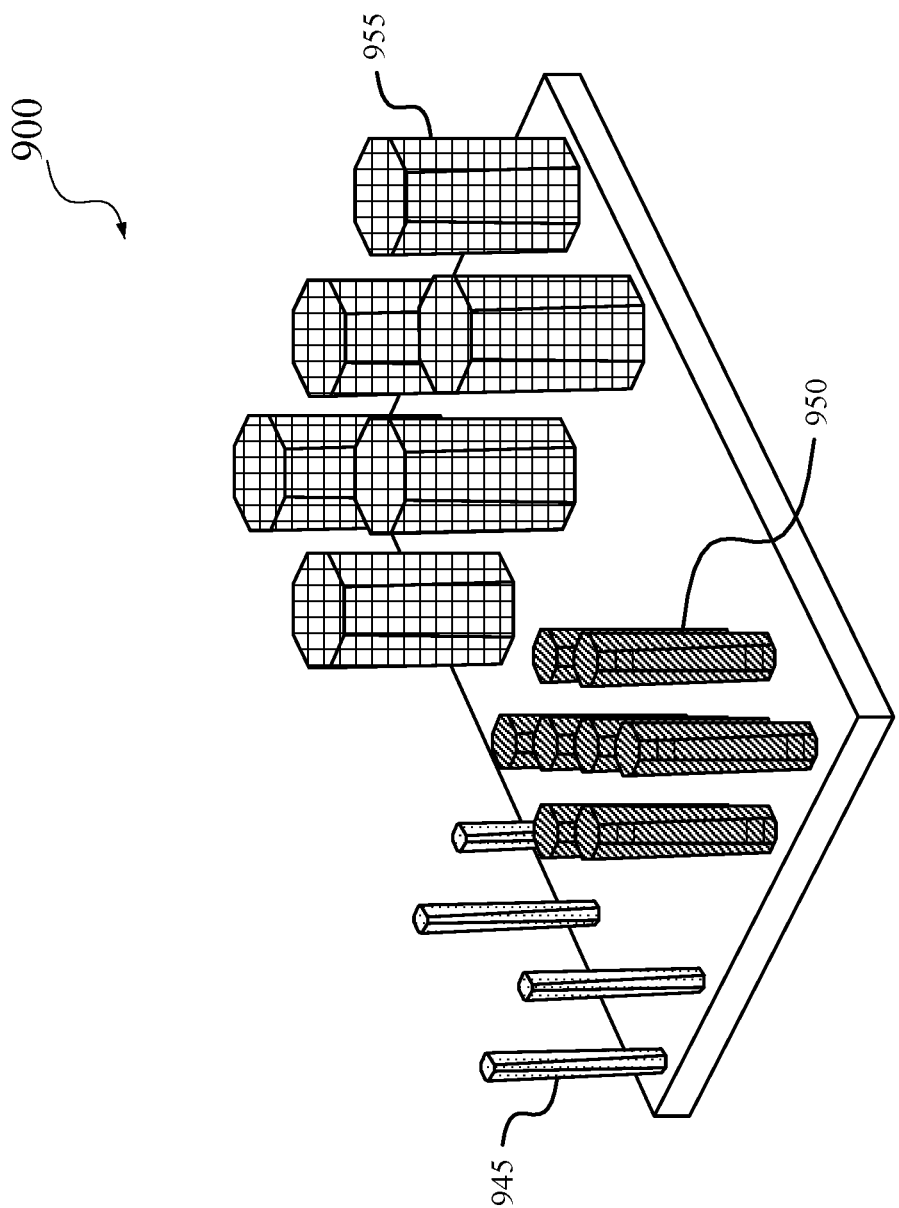
FIG. 9 shows a schematic perspective view of an exemplary device according to some embodiments of the present technology.

FIG. 9 shows a schematic perspective view of an exemplary device 900 according to some embodiments of the present technology. The device 900 may include a plurality of first light sources 945, a plurality of second light sources 950, and a plurality of third light sources 955 that are natively formed on a substrate. The first light sources 945 may be configured to emit light having a first wavelength, the second light sources 950 may be configured to emit light having a second wavelength, and the third light sources 955 may be configured to emit light having a third wavelength. In some examples, the first wavelength may fall within the red region of the electromagnetic spectrum, the second wavelength may fall within the green region of the electromagnetic spectrum, and the third wavelength may fall within the blue region of the electromagnetic spectrum.

As discussed above, the critical dimensions of the first light sources 945, the second light sources 950, and the third light sources 955 may be selected to produce the desired emission wavelengths. Alternatively or in addition, the pitch of the first light sources 945, the second light sources 950, and the third light sources 955 may be selected to produce the desired emission wavelengths. For example, the pitch may be increased in order to increase the In incorporation and the emission wavelength, because it is easier to incorporate In into structures that are spaced farther apart and therefore do not block In incorporation from the side. Alternatively or in addition, the distance between adjacent first light sources 945, the distance between adjacent second light sources 950, and the distance between adjacent third light sources 955 may be selected to produce the desired emission wavelengths. For example, the distance between adjacent light sources may be increased in order to increase the In incorporation and the emission wavelength. The distance between adjacent light sources may be defined as the spacing between the nearest sides of the adjacent light sources. In some examples, the distance between adjacent light sources may be between about 200 nm and about 1,000 nm.

Alternatively or in addition, the amount of In incorporated into the active region may be selected to produce the desired emission wavelengths. For example, an In concentration between about 0.10 and about 0.30 may be incorporated into the first light sources 945, an In concentration between about 0.00 and about 0.15 may be incorporated into the second light sources 950, and an In concentration between about 0.00 and about 0.05 may be incorporated into the third light sources 955. Alternatively or in addition, the light sources may be formed to have various shapes. For example, the light sources may include square mesas, rectangular mesas, disk-shaped mesas, circular mesas, square pyramids, striped pyramids, cylinders, rods, wires, or nanowires. The first light sources 945, the second light sources 950, and the third light sources 955 may have different shapes or the same shapes.

Any or all of the techniques discussed above may be combined in order to natively form light sources with emission wavelengths in the red, green, and blue regions of the electromagnetic spectrum on the same substrate. For example, the three-dimensional shapes of the light sources, the critical dimensions of the light sources, the concentration of In within the semiconductor layers and/or the active regions of the light sources, the heights of the active regions above the dielectric layer, the porosity of layers on which the light sources are formed, the strain of layers on which the light sources are formed, the polarity of emission surfaces of the light sources, the formation of v-pits in the emission surfaces, the number of light sources per die, and/or the spacing between adjacent light sources may be adjusted to provide the desired emission wavelengths.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a material" includes a plurality of such materials, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A device comprising:
a substrate;
a dielectric layer formed on the substrate;
a first light source configured to emit first light characterized by a first wavelength, wherein the first light source is natively formed on a first region of the substrate and is arranged within a first opening of the dielectric layer, and wherein the first light source comprises:
a first semiconductor layer comprising at least one of GaN or InGaN,
a first porous semiconductor layer formed on the first semiconductor layer, the first porous semiconductor layer comprising GaN having a first porosity, and
a first relaxed semiconductor layer formed on the first porous semiconductor layer, the first relaxed semiconductor layer comprising InGaN having a first degree of relaxation;

a second light source configured to emit second light characterized by a second wavelength different from the first wavelength, wherein the second light source is natively formed on a second region of the substrate and is arranged within a second opening of the dielectric layer, and wherein the second light source comprises:
a second semiconductor layer comprising at least one of GaN or InGaN,
a second porous semiconductor layer formed on the second semiconductor layer, the second porous semiconductor layer comprising GaN having a second porosity different from the first porosity, and
a second relaxed semiconductor layer formed on the second porous semiconductor layer, the second relaxed semiconductor layer comprising InGaN having a second degree of relaxation different from the first degree of relaxation; and
a third light source configured to emit third light characterized by a third wavelength different from the first wavelength and the second wavelength, wherein the third light source is natively formed on a third region of the substrate and is arranged within a third opening of the dielectric layer.

2. The device of claim 1, wherein the first light source comprises an emission surface having a polarity that is at least one of semi-polar or non-polar.

3. The device of claim 1, wherein the first light source comprises a first active region having a first degree of relaxation, the second light source comprises a second active region having a second degree of relaxation, and the first degree of relaxation is different from the second degree of relaxation.

4. The device of claim 1, wherein the first light source comprises a first active region having a first percentage of In, the second light source comprises a second active region having a second percentage of In, and the first percentage of In is different from the second percentage of In.

5. The device of claim 1, wherein the first light source has a first shape, the second light source has a second shape, and the first shape is different from the second shape.

6. The device of claim 1, wherein:
the InGaN in the first relaxed semiconductor layer of the first light source has a first percentage of In,
the InGaN in the second relaxed semiconductor layer of the second light source has a second percentage of In, and
the first percentage of In is different from the second percentage of In.

7. The device of claim 1, wherein the first light source is characterized by a first critical dimension, the second light source is characterized by a second critical dimension, and the first critical dimension is different from the second critical dimension.

8. A device comprising:
a first light source configured to emit first light characterized by a first wavelength, wherein the first light source is formed on a first region of a substrate, and wherein a first semiconductor layer of the first light source comprises at least one of GaN or InGaN and is characterized by a first porosity;
a second light source configured to emit second light characterized by a second wavelength, wherein the second light source is formed on a second region of the substrate, and wherein a second semiconductor layer of the second light source comprises at least one of GaN or InGaN and is characterized by a second porosity; and a third light source configured to emit third light characterized by a third wavelength, wherein the third light source is formed on a third region of the substrate, and a third semiconductor layer of the third light source is characterized by a third porosity, wherein the first wavelength is different from the second wavelength and the third wavelength, and the second wavelength is different from the third wavelength, and wherein the first porosity is different from the second porosity and the third porosity, and the second porosity is different from the third porosity.

9. The device of claim 8, wherein the first light source comprises an emission surface that is at least one of semi-polar or non-polar.

10. The device of claim 1, wherein:

the first semiconductor layer has a first percentage of In, the second semiconductor layer has a second percentage of In, and the first percentage of In is different from the second percentage of In.

* * * * *